United States Patent [19]

Ahne et al.

[11] Patent Number: 5,104,773
[45] Date of Patent: Apr. 14, 1992

[54] PREPARING HIGHLY THERMORESISTANT RELIEF STRUCTURES

[75] Inventors: Hellmut Ahne, Roettenbach; Albert Hammerschmidt; Erwin Schmidt, both of Erlangen, all of Fed. Rep. of Germany

[73] Assignee: Siemens Aktiengesellschaft, Berlin & Munich, Fed. Rep. of Germany

[21] Appl. No.: 501,600

[22] Filed: Mar. 29, 1990

[30] Foreign Application Priority Data

Apr. 6, 1989 [DE] Fed. Rep. of Germany ....... 3911212

[51] Int. Cl.$^5$ ...................... G03F 7/038; G03F 7/039; G03F 7/30; G03F 7/40
[52] U.S. Cl. .................................... 430/326; 430/325; 430/945; 430/330; 430/270
[58] Field of Search ............... 430/325, 326, 945, 330, 430/270

[56] References Cited

U.S. PATENT DOCUMENTS

| | | | |
|---|---|---|---|
| 4,332,883 | 6/1982 | Ahne et al. | 430/322 |
| 4,339,521 | 7/1982 | Ahne et al. | 430/192 |
| 4,366,230 | 12/1982 | Ahne et al. | 430/311 X |
| 4,371,685 | 2/1983 | Ahne et al. | 528/73 |
| 4,395,482 | 7/1983 | Ahne et al. | 430/326 |
| 4,622,285 | 11/1986 | Ahne et al. | 430/270 X |
| 4,849,051 | 7/1989 | Ahne et al. | 156/659.1 |
| 4,927,736 | 5/1990 | Mueller et al. | 430/270 X |

FOREIGN PATENT DOCUMENTS 0291778 11/1988 European Pat. Off. .

OTHER PUBLICATIONS

Richard W. Decker, "Laser Exposes PCB's: Computer Controlled Scanning Replaces Photomasks", *Printed Circuit Manufacturing*, Dec. 1979 pp. 20-24.
"Imidization of Polyamide Acid by Laser Radiation", Sov. J. Quant. Electron, vol. 4, No. 10, Apr. 1975 pp. 1287-1288.
"Thermal Action of Laser Radiation of Imidization", Sov. J. Quantum Electron, vol. 12, No. 10, Oct. 1982 pp. 1330-1333.

*Primary Examiner*—Cynthia Hamilton
*Attorney, Agent, or Firm*—Kenyon & Kenyon

[57] ABSTRACT

Highly thermoresistant relief structures can be produced simply and cost-effectively from polybenzoxazole precursors which do not have any polymerizable groups, respectively without any photoactive components being present, when soluble hydroxypolyamides are applied in the form of a layer or film on a substrate and are irradiated through a mask by means of an UV-excimer laser with a power density $> 10^5$ W/cm$^2$ per pulse, and are developed with an aqueous-alkaline developing agent and subsequently tempered.

21 Claims, No Drawings

PREPARING HIGHLY THERMORESISTANT RELIEF STRUCTURES

FIELD OF THE INVENTION

The invention relates to a method for preparing highly thermoresistant relief structures from oligomeric and/or polymeric polybenzoxalzole precursors.

BACKGROUND OF THE INVENTION

Soluble polybenzoxazole precursors are used as a resin base in thermoresistant photoresists for the preparation of highly thermoresistant relief structures, that is for the cost-effective, direct structuring of organic insulating layers. The polybenzoxazoles obtained from the precursors are distinguished by high temperature resistance, low water absorption and excellent electrical properties (c.f. EP-OS 0 291 778); therefore, they are suited as organic dielectrics in semiconductor production and also as etching masks, particularly in alkaline etching processes.

Photoresists based on polybenzoxazole precursors can be photostructured by means of conventional printing devices (contact printing or projection printing). In this case however, it is necessary for the photoresist to have photosensitive groups, respectively for the photosensitive resist to component a photoactive component. Photostructurable polybenzoxazole precursors with cross-linkable, unsaturated groups, which are used as negative resists, are known for example from the EP-PS 0 041 677. Positive resists based on polybenzoxazole precursors with diazoquinones, such as diazonaphthaquinones, as photoactive components are known from the following publications EP-OS 0 023 662, EP-OS 0 291 779 and DE-OS 37 16 629.

In the case of both of the named resist types, difficulties can arise that are caused by the photoreactive groups, respectively by the photoactive components. Namely, unsaturated groups tend to polymerize and, as a result, produce a limited viscosity stability for the resist solutions. Diazoquinones are not very thermostable and can react with functional groups, for example with amino end groups. This also has an unfavorable effect on the storage stability as well as on the reproducibility of the photolithographic process. Moreover, for processing, the sensitive photoresists require rooms supplied with yellow light in order to exclude wavelengths of <500 nm.

Accordingly, it is an object of the invention to specify a method which allows highly thermoresistant relief structures to be produced simply and cost-effectively from polybenzoxazole precursors.

It is a further object of the invention to provide a method for producing highly thermoresistant relief structures without the difficulties, particularly with regard to storage stability and reproducibility, which have heretofore been encountered with positive and negative resists based on polyhenzoxazole.

SUMMARY OF THE INVENTION

In accordance with the invention soluble hydroxypolyamides of the following structure

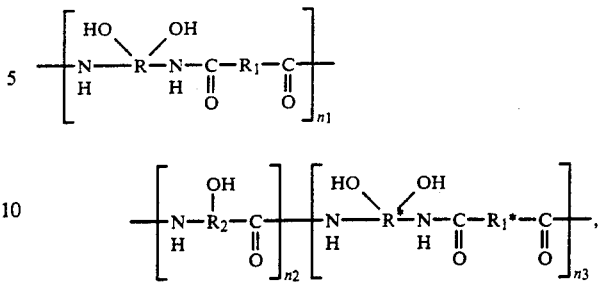

where R, R*, $R_1$, $R_1$* and $R_2$ are aromatic groupings and, with respect to $n_1$, $n_2$ and $n_3$, the following applies:

$n_1 = 1$ to 100, $n_2$ and $n_3 = 0$, or
$n_1$ and $n_2 = 1$ to 100, $n_3 = 0$, or
$n_2 = 1$ to 100, $n_1$ and $n_3 = 0$, or $n_1$, $n_2$ and $n_3 = 1$ to 100 (with R ≠ R* and/or $R_1$ ≠ $R_1$*), or $n_1$ and $n_3 = 1$ to 100, $n_2 = 0$ (with R ≠ R* and/or $R_1$ ≠ $R_1$*), are applied in the form of a layer or film on a substrate and are irradiated through a mask by means of an UV-excimer laser with a power density $> 10^5$ W/cm² per pulse, and are developed with an aqueous-alkaline developing agent and subsequently tempered.

DETAILED DESCRIPTION OF THE INVENTION

With the method according to the invention, polybenzoxazole precursors are able to be photostructured without the existence of polymerizable, that is unsaturated groups, respectively without photoactive components, with the aid of an excimer laser, for example an XeCl-laser, whose emission range lies in the ultraviolet. Thus, by means of laser irradiation (through an overlay mask) for the first time relief structures can be produced photolithographically solely with the application of precursors of highly thermoresistant polymers, that is without adding photoactive components, respectively without the presence of cross-linkable groups. Since there are no photoactive components, respectively no groups that are cross-linkable through light, the polymer precursors employed in the method according to the invention and their solutions, as well as the layers or films produced from them, are absolutely insensitive to light (which can come for example from the surroundings or from lamps). Moreover, these polymer precursors—and thus the method according to the invention as well—do not require any supply of yellow light in the processing rooms.

Furthermore, the method according to the invention offers the advantage that the layers and films from the polybenzoxazole precursors—as a function of the laser capacity or of the energy density—are able to be structured alternatively as a positive or negative resist with subsequent alkaline development. In addition, fine structures can be produced in the cross-over area between the positive and negative characteristics at the boundary between the exposed and unexposed areas.

In the case of polyamidocarboxylic acids, cyclization reactions, that is imidization reactions, that are induced by laser radiation are known (c.f. "Sov. J. Quantum Electron.", vol 4 (1975) pp 1287 and 1288, as well as "Sov. J. Quantum Electron", vol. 12 (1982), pp 1330 to 1333). This case, however, concerns thermally excited processes, so-called thermochemical processes; the operation is performed namely by means of a gas laser, that is a $CO_2$ laser, in the IR-range (pulse capacity 50 to 100 W).

The relief structures produced according to the method of the invention have a high definition and are comparable to those structures that are obtained photolithographically with the application of known photoresist solutions. Moreover, with the method according to the invention, the layer thickness is reduced to a lesser extent than in the case when relief structures are produced with the application of photoactive components. Compared to the structures obtained with lasers using the so-called hole-burning process, that is directly by the erosion- machining of materials, the relief structures produced with the method of the invention have a higher definition and are finer in structure. Over and above that, this method ensures that no residues remain on the substrate, which can in fact happen with the hole-burning method as a result of carbonization.

As already explained, with the method according to the invention, the polymer precursors—depending on laser capacity and energy density—exhibit characteristics corresponding to those of positive or negative resists; that is positive or negative relief structures are able to be produced from the polymer layers. Thus a high energy density and laser capacity cause a behavior as known from positive resists, that is the exposed regions are more soluble in the (alkaline) developing agent than are the unexposed regions. A low energy density and laser capacity lead, however, to a behavior as found in negative resists, that is at the exposed locations —compared to the unexposed locations—there is a reduction of solubility in the (alkaline) developing agent. This in fact is due to a (partial) cyclization. When the energy density and laser capacity are average, both the exposed as well as the unexposed locations are soluble in the (alkaline) developing agent in the cross-over area between the positive and negative characteristics, and, after development, fine lines or structures remain at the boundary between these two regions. The following, shown in detail, applies for the irradiation of the hydroxypolyamides:

Positive relief images are obtained under the following conditions:

| | |
|---|---|
| Energy dose: | 3 to 12 J/cm$^2$; |
| Energy density (per pulse): | 100 to 150 mJ/cm$^2$; |
| Power density (per pulse): | 2 to 3 × 10$^6$ W/cm$^2$. |

Negative relief images are obtained under the following conditions:

| | |
|---|---|
| Energy dose: | 4 to 12 J/cm$^2$; |
| Energy density (per pulse): | 40 to 60 mJ/cm$^2$; |
| Power density (per pulse): | 8 × 10$^5$ to 1.2 × 10$^6$ W/cm$^2$. |

Fine structures in the region between the exposed and the unexposed locations are obtained under the following conditions:

| | |
|---|---|
| Energy dose: | approx. 4 J/cm$^2$; |
| Energy density (per pulse): | approx. 100 mJ/cm$^2$; |
| Power density (per pulse): | 1.5 to 2 × 10$^6$ W/cm$^2$. |

The hydroxypolyamides used in the method according to the invention preferably show aromatic groups of the following structure. R and R* can have the following meaning:

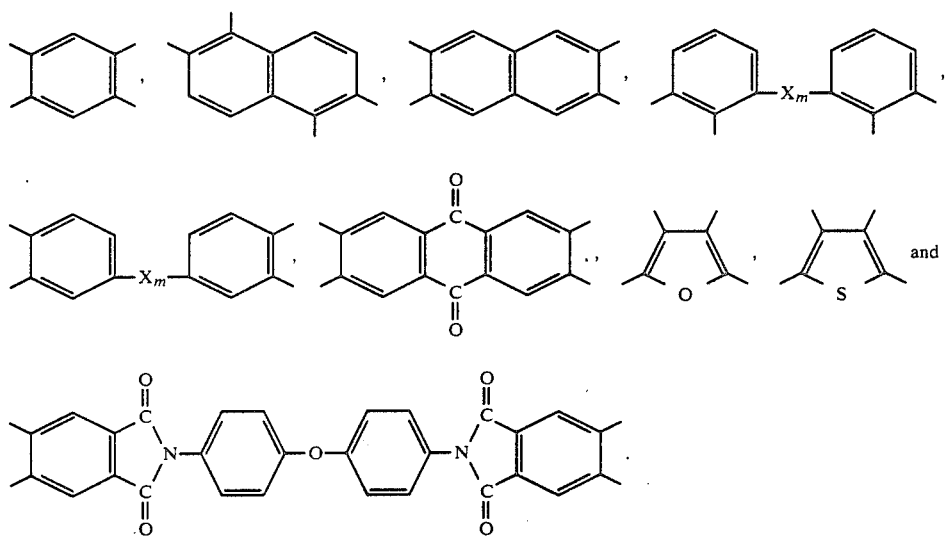

$R_1$ and $R_1^*$ can have the following meaning, where the H atoms can also be substituted by Cl or Br:

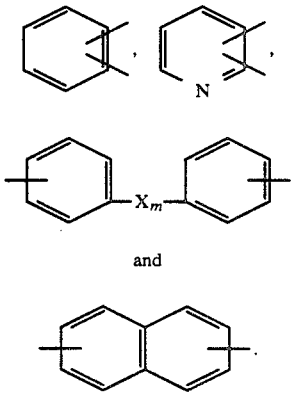

$R_2$ can have the following meaning:

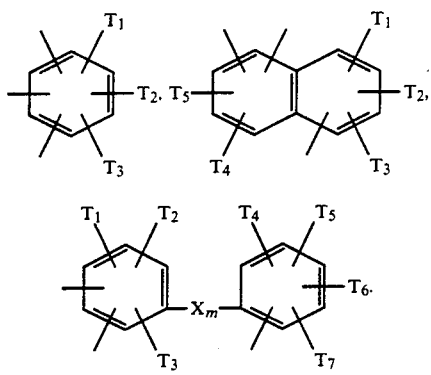

$T_1$ to $T_7$ thereby signify H or alkyl, $m=0$ or 1, and X signifies:

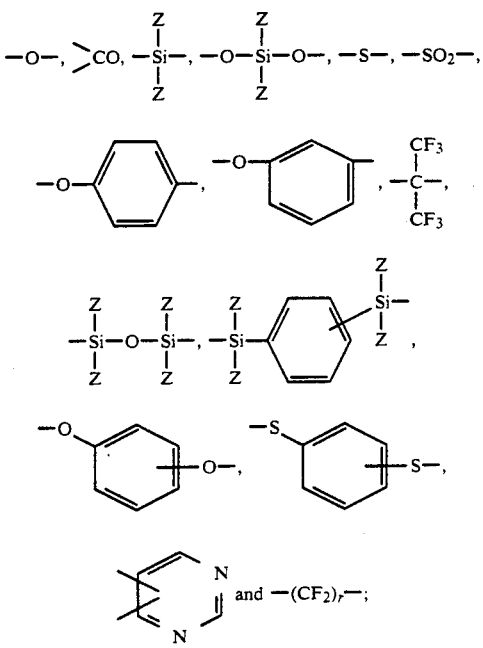

The following applies thereby:

Z=alkyl with 1 to 10 carbon atoms or aryl, and $r=2$ to 18.

According to the method of the invention, the polybenzoxazole precursors, that is the hydroxypolyamides, are advantageously deposited as a solution in an organic solvent on the substrate. Preferably N-methylpyrrolidone is used as a solvent Moreover, other organic solvents with similar properties can be used as well, such as dimethyl formamide and N.N-dimethyl acetamide, as well as mixtures of the named solvents.

An adhesive agent and/or a wetting agent can advantageously be used according to the method of the invention. The adhesive agent and respectively the wetting agent can thereby be mixed with the polymer solution, but they can also be applied to the substrate before it is coated. The polymer solution is preferably deposited on the substrate using centrifugal techniques, as well as the immersion or spray techniques. In addition, however, other coating methods such as brushing and rolling can be used as well. The substrate preferably consists of glass, metal—in particular aluminum—, plastic or a semi-conductive material The structured polymer layers are converted into highly thermoresistant polybenzoxazoles by means of a tempering process. Generally, temperatures of between 200° and 500° C. are selected. Preferably, the tempering operation is performed at a temperature of between 300° and 450° C.

The invention shall be explained in greater detail based on the following exemplified embodiments.

EXAMPLE 1

Preparation of a Polymer Layer 18 parts by weight of a polybenzoxazole precursor, prepared from 2.2-bis(3-amino-4-hydroxyphenyl)-1.1.1.3 3.3-hexafluoropropane hexafluoropropane (50 mole %), 3,3'-dihydroxybenzidine (50 mole %) and isophthalic acid dichloride (90 mole %) (c.f "Polym. Letters", vol. 2 (1964), pp 655 fol) are dissolved in 45 parts by weight of N-methylpyrrolidone. The solution is then pressure- filtered through a 0.8 μm filter. Subsequently, the filtered solution is applied in a spin-coating process at 2800 rpm/20 s on an aluminum wafer treated with an adhesive agent (0.5% solution of N-(2-aminoethyl)-3-aminopropyl-methyl-dimethoxysilane in methanol/water (95/5 v/v), after standing for 24 hours applied at 5000 rpm/30 s and annealed at 80° C. for 10 minutes) and then dried for 12 minutes at 90° C. in a forced air oven. A polymer layer with a thickness of 4.9 μm is obtained.

EXAMPLE 2

Producing Negative Structures

A polymer layer prepared according to Example 1 is irradiated by means of an excimer laser (wavelength: 308nm) with an energy dose of between 4 and 12 $J/cm^2$ at an energy density of 40 to 60 $mJ/cm^2$ per pulse, and a power density of $8 \times 10^5$ to $1.2 \times 10^6$ $W/cm^2$ per pulse through a grid (holes: 200 μm, strips: 120 μm, reduction: 1:5); the loss of layer thickness amounts to 0 to 5%. After being exposed, the substrate is developed for 90 s with an aqueous- alkaline developing agent (NMD-3, 0.25%) (loss of layer thickness: approx. 10%) and subsequently tempered in a diffusion oven under nitrogen (tempering program: room temperature to 170° C.: one hour, 170° to 300° C.: one hour, 300° to 400° C.: one hour, 400° C. one hour, 400° C. to room temperature: four hours). Small, highly temperature- resistant plates are thereby formed 24 with a layer thickness of 3.7 μm.

EXAMPLE 3

Producing Positive Structures

A polymer layer prepared according to Example 1 is irradiated by means of an excimer laser (wavelength: 308nm) with an energy dose of between 3 and 12 $J/cm^2$ at an energy density of 100 to 150 $mJ/cm^2$ per pulse density of 2 to $3 \times 10^6$ $W/cm^2$ per pulse through a grid (holes: 200 μm, strips: 120 μm, reduction: 1:5): the loss of layer thickness at the exposed locations is between 60 and 80%. After being exposed, the substrate is developed for 90 s with an aqueous-alkaline developing agent (NMD-3, 0.25%) (loss of layer thickness at the unexposed locatons: 0%) and subsequently tempered in a diffusion oven under nitrogen (tempering program: room temperature to 170° C.: one hour, 170° to 300° C.: one hour, 300° to 400° C.: one hour, 400° C.: one hour, 400° C. to room temperature: four hours). A highly temperature-resistant lattice structure is thereby formed with a layer thickness of 3.7 μm.

EXAMPLE 4

Producing Fine Lines

A polymer layer prepared according to Example 1 is irradiated by means of an excimer laser (wavelength: 308nm) with an energy dose of approx. 4 J/cm$^2$ at an energy density of approxm. 100 mJ/cm$^2$ per pulse and a power density of approx. $2 \times 10^6$ W/cm$^2$ per pulse through a grid (holes: 200 μm, strips: 120 μm, reduction: 1:5). After being exposed, the substrate is developed for 90 s with an aqueous-alkaline developing agent (NMD-3, 0.25%) loss of layer thickness at the unexposed locations: 0%) and subsequently tempered in a diffusion oven under nitrogen (tempering program: room temperature to 170° C.: one hour, 170° to 300° C.: one hour, 300° to 400° C.: one hour, 400° C.: one hour, 400° C. to room temperature: four hours). Fine lines with a layer thickness of 3.7 μm are thereby formed in the boundary region between the exposed and unexposed locations.

What is claimed is:

1. A method for preparing highly thermoresistant relief structure from polybenzoxazole precursors without photoactive components comprising the steps of applying a layer or film consisting essentially of a soluble hydroxypolyamide, without photoactive components, on a substrate, irradiating said layer or film through a mask by means of an UV-eximer laser with a power density $>10^5$ w/cm$^2$ per pulse, developing said layer or film with an aqueous-alkaline developing agent to result in a relief structure and subsequently tempering the resulting relief structure, wherein the soluble hydroxypolyamides have the following structure:

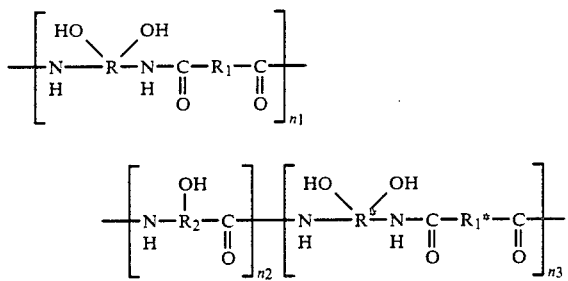

where R, R*, R$_1$, R$_1$* and R$_2$ are aromatic groupings and, with respect to n$_1$, n$_2$ and n$_3$, the following applies:
n$_1$ = 1 to 100, n$_2$ and n$_3$ = 0, or
n$_1$ and n$_2$ = 1 to 100, n$_3$ = 0, or
n$_2$ = 1 to 100, n$_1$ and n$_3$ = 0, or
n$_1$, n$_2$ and n$_3$ = 1 to 100 (with R * R* and/or R$_1$* R$_1$*), or
n$_1$ and n$_3$ = 1 to 100, n$_2$ = 0 (with R * R* and/or R$_1$ * R$_1$*).

2. A method according to claim 1 wherein the hydroxypolyamide is deposited, as a solution in an organic solvent, on the substrate.

3. A method according to claim 2 wherein N-methylpyrrolidone is used as a solvent.

4. A method according to claim 2 wherein at least one of an adhesive agent and a wetting agent is included in the hydroxypolyamide solution which is applied to the substrate.

5. A method according to claim 1 wherein the step of tempering is conducted at a temperature of between 200 and 500° C.

6. A method according to claim 5 wherein the step of tempering is conducted at a temperature of from 300° to 450° C.

7. A method according to claim 1 wherein the step of irradiating is carried out with an energy dose of 4 to 12 J/cm$^2$, an energy density per pulse of 40 to 60 mJ/cm$^2$ and a power density per pulse of $8 \times 10^5$ to $1.2 \times 10^6$ W/cm$^2$, whereby after development, a negative relief image is obtained.

8. A method according to claim 7 wherein the hydroxypolyamide is deposited, as a solution in an organic solvent, on the substrate.

9. A method according to claim 8 wherein at least one of an adhesive agent and a wetting agent is included in the hydroxypolyamide solution which is applied to the substrate.

10. A method according to claim 9 wherein the step of tempering is conducted at a temperature of between 200 and 500° C.

11. A method according to claim 1 wherein the step of irradiating is carried out with an energy dose of 3 to 12 J/cm$^2$, an energy density per pulse of 100 to 150 mJ/cm$^2$ and a power density per pulse of 2 to $3 \times 10^6$ W/cm$^2$, whereby after development, a positive relief image is obtained.

12. A method according to claim 11 wherein the hydroxypolyamide is deposited, as a solution in an organic solvent, on the substrate.

13. A method according to claim 12 wherein at least one of an adhesive agent and a wetting agent is included in the hydroxypolyamide solution which is applied to the substrate.

14. A method according to claim 11 wherein the step of tempering is conducted at a temperature of between 200 and 500° C.

15. A method according to claim 1 wherein the step of irradiating is carried out with an energy dose of about 4 J/cm$^2$, an energy density per pulse of about 100 mJ/cm$^2$ and a power density per pulse of 1.5 to $2 \times 10^6$ W/cm$^2$, whereby after development, fine structures are obtained in the region between the exposed and the unexposed locations.

16. A method according to claim 15 wherein the hydroxypolyamide is deposited, as a solution in an organic solvent, on the substrate.

17. A method according to claim 16 wherein at least one of an adhesive agent and a wetting agent is included in the hydroxypolyamide solution which is applied to the substrate.

18. A method according to claim 15 wherein the step of tempering is conducted at a temperature of between 200° and 500° C.

19. A method for preparing highly thermoresistant relief structures from polybenzoxazole precursors comprising the steps of applying a soluble hydroxypolyamide in the form of a layer or film on a substrate, irradiating said layer or film through a mask by means of a UV-excimer laser with an energy dose of 4 to 12 J/cm$^2$, an energy density per pulse of 40 to 60 mJ/cm$^2$ and a power density per pulse of $8 \times 10^5$ to $1.2 \times 10^6$ W/cm$^2$, developing said layer or film with an aqueous-alkaline developing agent to result in a relief structure having a negative relief image and subsequently tempering the resulting relief structure, wherein the soluble hydroxypolyamides have the following structure:

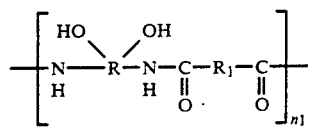

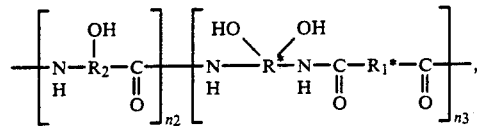

wherein R, R*, $R_1$, $R_1$* and $R_2$ are aromatic groupings and, with respect to $n_1$, $n_2$ and $n_3$, the following applies:

$n_1 = 1$ to 100, $n_2$ and $n_3 = 0$, or $n_1$ and $n_2 = 1$ to 100, $n_3 = 0$, or $n_2 = 1$ to 100, $n_1$ and $n_3 = 0$, or $N_1$, $n_2$ and $n_3 = 1$ to 100 (with $R \neq R$* and/or $R_1 \neq R_1$*), or $n_1$ and $n_3 = 1$ to 100, $n_2 = 0$ (with $R \neq R$* and/or $R_1 \neq R_1$*).

20. A method for preparing highly thermoresistant relief structures from polybenzoxazole precursors without photoactive components comprising the steps of applying a layer or film consisting essentially of a soluble hydroxypolyamide, without photoactive components, on a substrate, irradiating said layer or film through a mask by means of a UV-excimer laser with an energy dose of 3 to 12 J/cm², an energy density per pulse of 100 to 150 mJ/cm² and a power density per pulse of $2 \times 10^6$ to $3 \times 10^6$ W/cm², developing said layer or film with an aqueous-alkaline developing agent to result in a relief structure having a positive relief image and subsequently tempering the resulting relief structure, wherein the soluble hydroxypolyamides have the following structure:

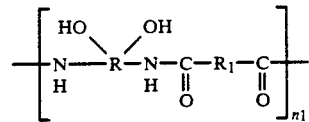

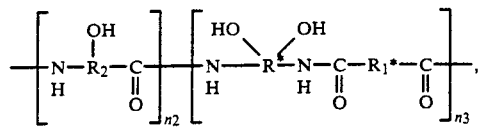

wherein R, R*, $R_1$, $R_1$* and $R_2$ are aromatic groupings and, with respect to $n_1$, $n_2$ and $n_3$, the following applies:

$n_1 = 1$ to 100, $n_2$ and $n_3 = 0$, or $n_1$ and $n_2 = 1$ to 100, $n_3 = 0$, or $n_2 = 1$ to 100, $n_1$ and $n_3 = 0$, or $n_1$, $n_2$ and $n_3 = 1$ to 100 (with $R \neq R$* and/or $R_1 \neq R_1$*), or $n_1$ and $n_3 = 1$ to 100, $n_2 = 0$ (with $R \neq R$* and/or $R_1 \neq R_1$*).

21. A method for preparing highly thermoresistant relief structures from polybenzoxazole precursors comprising the steps of applying a soluble hydroxypolyamide int he form of a layer or film on a substrate, irradiating said layer or film through a mask by means of a UV-excimer laser with an energy dose of about 4 J/cm², an energy density per pulse of about 100 mJ/cm² and a power density per pulse of $1.5 \times 10^6$ to $2 \times 10^6$ W/cm², developing said layer or film with an aqueous-alkaline developing agent to result in a relief structure having fine structures in the region between the exposed and the unexposed locations and subsequently tempering the resulting relief structure, wherein the soluble hydroxypolyamides have the following structure:

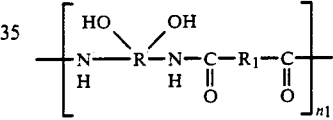

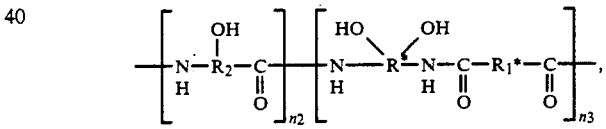

wherein R, R*, $R_1$, $R_1$* and $R_2$ are aromatic groupings and, with respect to $n_1$, $n_2$ and $n_3$, the following applies:

$n_1 = 1$ to 100, $n_2$ and $n_3 = 0$, or $n_1$ and $n_2 = 1$ to 100, $n_3 = 0$, or $n_2 = 1$ to 100, $n_1$ and $n_3 = 0$, or $n_1$, $n_2$ and $n_3 = 1$ to 100 (with $R \neq R$* and/or $R_1 \neq R_1$*), or $n_1$ and $n_3 = 1$ to 100, $n_2 = 0$ (with $R \neq R$* and/or $R_1 \neq R_1$*).

* * * * *